United States Patent
Gambino et al.

(10) Patent No.: US 9,799,720 B2
(45) Date of Patent: Oct. 24, 2017

(54) INDUCTOR HEAT DISSIPATION IN AN INTEGRATED CIRCUIT

(71) Applicant: International Business Machines Corporation, Armonk, NY (US)

(72) Inventors: Jeffrey P. Gambino, Westford, VT (US); Qizhi Liu, Lexington, MA (US); Zhenzhen Ye, Groton, MA (US); Yan Zhang, Groton, MA (US)

(73) Assignee: International Business Machines Corporation, Armonk, NY (US)

( * ) Notice: Subject to any disclaimer, the term of this patent is extended or adjusted under 35 U.S.C. 154(b) by 83 days.

(21) Appl. No.: 14/484,536

(22) Filed: Sep. 12, 2014

(65) Prior Publication Data

US 2016/0079339 A1 Mar. 17, 2016

(51) Int. Cl.
| | |
|---|---|
| *H01L 49/02* | (2006.01) |
| *H01L 21/762* | (2006.01) |
| *H01L 27/02* | (2006.01) |
| *H01L 29/06* | (2006.01) |
| *H01L 23/64* | (2006.01) |
| *H01L 29/786* | (2006.01) |
| *H01L 23/36* | (2006.01) |

(52) U.S. Cl.
CPC ........ *H01L 28/10* (2013.01); *H01L 21/76283* (2013.01); *H01L 23/36* (2013.01); *H01L 23/645* (2013.01); *H01L 29/0649* (2013.01); *H01L 29/78603* (2013.01); *H01L 27/0248* (2013.01); *H01L 2924/0002* (2013.01); *H01L 2924/19042* (2013.01); *H01L 2924/19104* (2013.01)

(58) Field of Classification Search
CPC ............. H01L 29/0649; H01L 27/0248; H01L 21/76283
See application file for complete search history.

(56) References Cited

U.S. PATENT DOCUMENTS

| 5,133,403 A | 7/1992 | Yokono et al. |
| 5,446,314 A | 8/1995 | Melnick et al. |
| (Continued) | | |

FOREIGN PATENT DOCUMENTS

| JP | 11054651 A | 2/1999 |
| JP | 2006120953 A | 5/2006 |
| JP | 2009283840 A | 12/2009 |

OTHER PUBLICATIONS

Sagkol et al., "Thermal Effects in Suspended RF Spiral Inductors", IEEE Electron Device Letters, vol. 26, No. 8, Aug. 2005, pp. 541-543.

(Continued)

*Primary Examiner* — Caleb Henry
*Assistant Examiner* — Mounir Amer
(74) *Attorney, Agent, or Firm* — Steven J. Meyers; Hoffman Warnick LLC

(57) ABSTRACT

The present invention relates generally to semiconductor structures and methods of manufacturing and, more particularly, to improving heat dissipation of devices, such as active devices like inductors, by filling portions of the semiconductor structure with thermally conductive and electrical isolating material that may serve as a heat sink to a base substrate. In an embodiment, an inductor may be formed above a cavity region in which the thermally conductive and electrical isolating material has been formed. Heat may then be dissipated from the inductor to the cavity, and eventually to the base substrate, through trenches filled with the thermally conductive and electrical isolating material.

18 Claims, 18 Drawing Sheets

(56) References Cited

U.S. PATENT DOCUMENTS

| | | | |
|---|---|---|---|
| 6,242,778 B1 | 6/2001 | Marmillion et al. | |
| 6,303,413 B1* | 10/2001 | Kalnitsky | H01L 21/76264 257/E21.564 |
| 6,326,314 B1 | 12/2001 | Merrill et al. | |
| 6,476,483 B1 | 11/2002 | Adler et al. | |
| 6,483,147 B1 | 11/2002 | Lin | |
| 6,800,933 B1 | 10/2004 | Mathews et al. | |
| 7,012,007 B1 | 3/2006 | Goo et al. | |
| 7,289,329 B2 | 10/2007 | Chen et al. | |
| 7,994,895 B2 | 8/2011 | Coolbaugh et al. | |
| 8,073,031 B2 | 12/2011 | Tan et al. | |
| 2008/0217653 A1* | 9/2008 | Sonsky | H01L 21/76264 257/190 |
| 2009/0212362 A1* | 8/2009 | Cheng | H01L 21/84 257/347 |
| 2009/0250738 A1* | 10/2009 | Dyer | H01L 21/84 257/301 |
| 2010/0213523 A1* | 8/2010 | Cheng | H01L 21/84 257/304 |
| 2012/0038024 A1* | 2/2012 | Botula | H01L 21/76289 257/510 |
| 2012/0146098 A1 | 6/2012 | Dahlstrom et al. | |
| 2012/0261792 A1* | 10/2012 | Cheng | H01L 21/84 257/510 |
| 2012/0292700 A1* | 11/2012 | Khakifirooz | H01L 21/84 257/347 |
| 2013/0032868 A1* | 2/2013 | Pei | H01L 21/3081 257/301 |
| 2015/0348825 A1* | 12/2015 | Hebert | H01L 21/764 257/522 |

OTHER PUBLICATIONS

Sun et al., "High performance MEMS inductors fabricated on localised and planar thick SiO2 layer", vol. 41, No. 7, Electronics Letter, Mar. 31, 2005, pp. 446-447.

Rofougaran et al., "A 11GHz CMOS RF front-end IC for a direct-conversion wireless receiver", IEEE Journal of Solid-state Circuits, vol. 31, Issue 7, Jul. 1996, pp. 880-889.

Hisamoto et al., "Suspended SOI Structure for Advanced 0.1-m CMOS RF Devices", IEEE Transactions on Electron Devices, vol. 45, No. 5, May 1998, pp. 1039-1046.

Ozgur et al., "High Q Backside Micromachined CMOS Inductors", The Department of Electrical Engineering and Computer Science, The George Washington University, Washington, DC 20052, Semiconductor Electronics Division, National Institute of Standards and Technology, Gaithersburg, MD 20899-8123, pp. II-577-II-580.

"Aluminum Nitride, AlN Ceramic Properties", http://accuratus.com/alumni.html, accessed on Apr. 1, 2014, pp. 1-2.

Guerrero et al., "Growth of AlN Films by Chemical Vapor Deposition", Mexican Society on Science and Technology of Surfaces and Materials, Dec. 9, 1999, pp. 82-84.

Rice et al., "Homoepitaxial deposition of AlN on (0001)-oriented AlN substrates by MOCVD", Department of Materials Science and Engineering, North Carolina State University, Raleigh, NC 27695-7919, USA, 2 HexaTech, Inc., 991 Aviation Parkway, Suite 800, Morrisville, NC 27560, USA, 1 page.

Khan et al., "High rate etching of AlN using BCl3/Cl2/Ar inductively coupled plasma", Materials Science and Engineering B95, 2002, www.elsevier.com/locate/mseb, Elsevier Science B.V., pp. 51-54.

Chen et al., Dry etching of AlN films using the plasma generated by fluoride, Vacuum, vol. 83, 2009, Elsevier Ltd., pp. 282-285.

Sato et al., "Low-temperature metalorganic chemical vapor deposition of luminescent manganesedoped aluminum nitride films", Applied Physics Letter, American Institute of Physics, vol. 87, AIP Publishing, 2005, 4 pages.

La Spina et al., "PVD Aluminium Nitride as Heat Spreader in Siliconon-Glass Technology", Proc. 25th International Conference on Microelectronics (MIEL 2006), Belgrade, Serbia and Montenegro, May 14-17, 2006, 4 pages.

Roig et al., "Study of novel techniques for reducing self-heating effects in SOI power LDMOS", Solid-State Electronics, vol. 46, 2002, Elsevier Science Ltd., pp. 2123-2133.

Cole et al., "A Method to Overcome Self-Heating Effects in SOI MOSFETs", Micron Technology, 8000 S. Federal Way, Boise, ID 83707 USA, Boise State University, College of Engineering, Boise State University, Boise, ID 83725 USA, pp. 295-297.

* cited by examiner

INDUCTOR HEAT DISSIPATION IN AN INTEGRATED CIRCUIT

BACKGROUND

The present invention relates generally to semiconductor structures and methods of manufacturing and, more particularly, to improving heat dissipation in semiconductor devices.

As semiconductor structures continue to be scaled down in size and more devices are fabricated per integrated circuit, power demand may increase relative to available space. This may negatively affect the efficiency of heat dissipation in the structures, which in turn, may negatively affect the quality and reliability of the devices. Typically, trench isolation between adjacent semiconductor devices may be filled with poor thermally conductive material decreasing heat dissipation efficiency. Additionally, the buried layer in the semiconductor structures may prevent heat dissipation from inductors to a base silicon heat sink.

SUMMARY

According to an embodiment, a method is disclosed. The method may include: forming a first dielectric layer on a semiconductor on insulator (SOI) layer of a SOI substrate, the SOI substrate comprising a buried insulator layer located between the SOI layer and a base substrate layer; forming a cavity trench through the first dielectric layer and the SOI layer, the cavity trench exposing the buried insulator layer; forming a cavity in the buried insulator layer; depositing a thermally conductive and electrically isolating material in the cavity; filling the cavity trench with the thermally conductive and electrically isolating material; and forming an inductor above the cavity.

According to another embodiment, a method is disclosed. The method may include: forming a first dielectric layer on a semiconductor on insulator (SOI) layer of a SOI substrate, the SOI substrate comprising a buried insulator layer located between the SOI layer and a base substrate layer; forming a back end of the line (BEOL) dielectric layer on the first dielectric layer; forming a cavity trench through the BEOL dielectric layer, the first dielectric layer, and the SOI layer, the cavity trench exposing the buried insulator layer; forming a cavity in the buried insulator layer; depositing a thermally conductive and electrically isolating material in the cavity; filling the cavity trench with the thermally conductive and electrically isolating material; and forming an inductor above the cavity.

According to another embodiment, a structure is disclosed. The structure may include: a cavity in a buried insulator layer of a semiconductor on insulator (SOI) substrate, the buried insulator layer located above a base substrate layer and below a SOI layer, the cavity containing a thermally conductive and electrically isolating material; a first dielectric layer on the SOI layer; a cavity trench extending through the first dielectric layer and the SOI layer into the cavity, the cavity trench containing the thermally conductive and electrically isolating material; and an inductor above the cavity.

DETAILED DESCRIPTION

Figure 1:
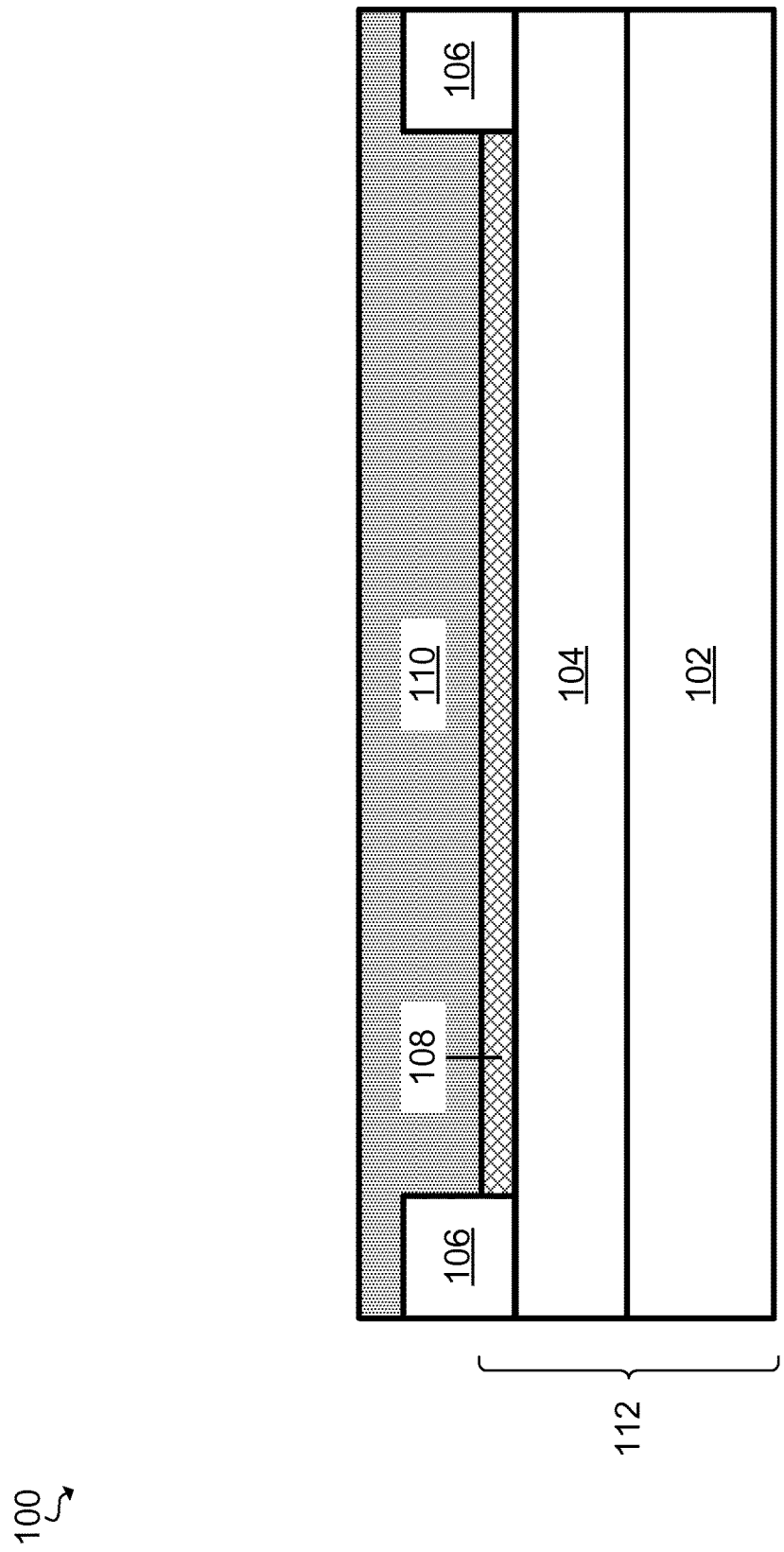
FIG. 1 is a cross section view illustrating a semiconductor structure, in accordance with an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to semiconductor structures and methods of manufacturing and, more particularly, to improving heat dissipation of devices, such as active devices like inductors, by filling portions of the semiconductor structure with thermally conductive and electrical isolating material. As semiconductor structures continue to be scaled down in size and more devices are fabricated per integrated circuit, power demand is increasing relative to available space. This may negatively affect the efficiency of heat dissipation in the structures, which in turn, may negatively affect the reliability of the devices and the Q value and resonance frequency of the inductors.

In addition, conventional trench isolation between adjacent semiconductor structures may be filled with poor thermally conductive and electrically isolating material, which may decrease heat dissipation efficiency. Also, in most radio frequency application, inductors consume a large portion of the device area, and no active devices are present underneath these inductors. The dielectric layers and a buried insulator layer in present below the inductor not only may constitute wasted space, but may negatively affect heat dissipation into a base substrate heat sink. Embodiments by which to fill a cavity formed in a buried insulator layer and trenches in a semiconductor structure below an inductor with high thermally conductive and electrically isolating material to improve heat dissipation of devices and inductors are described below with reference to FIGS. 1-18.

Referring now to FIG. 1, a cross section view of a semiconductor structure 100 is shown. In an embodiment, the semiconductor structure 100 may include one or more devices 106 formed on a semiconductor on insulator (SOI) substrate 112. In an embodiment, the devices 106 may be conventional field effect transistors (FETs). The SOI substrate 112 may include a base substrate layer 102, a buried insulator layer 104, and an SOI layer 108. A first dielectric layer 110 may be formed on the SOI layer 108 and the devices 106. The first dielectric layer 110 may be formed using conventional deposition techniques, such as, for example, chemical vapor deposition (CVD), plasma enhanced CVD (PECVD), thermal CVD (THCVD), sputtering, or spin-on deposition.

In an embodiment, the base substrate layer 102 and the SOI layer 108 may be composed of any semiconductor materials well known in the art, such as, for example, undoped silicon (Si), n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. Non-limiting examples of compound semiconductor materials include gallium arsenide, indium arsenide, and indium phosphide. It should be noted that embodiments are contemplated in which the base substrate layer 102 and the SOI layer 108 are composed of materials having the same composition, and in which the composition of the base substrate layer 102 is different than the composition of the SOI layer 108. Typically, the base substrate layer 102 may be about, but is not limited to, several hundred microns thick. It should be noted that the thickness of the base substrate layer 102 can vary depending on its diameter and the requirements for structural stability.

The buried insulator layer 104 may be composed of a dielectric material, such as, for example, an oxide. In an embodiment, the buried insulator layer 104 may be formed by implanting a high-energy dopant into a bulk semiconductor substrate, and then annealing the structure to form a buried oxide layer. The buried insulator layer 104 may have a thickness ranging from approximately 100 nm to approximately 2000 nm thick, although lesser and greater thickness are contemplated.

In an embodiment, the first dielectric layer 110 may be composed of one or several layers of an insulating material, such as, for example, an oxide, a nitride, or a borophosphosilicate glass (BPSG). In an embodiment, the first dielectric layer 110 may include a diffusion barrier (not shown) that may protect the devices 106. The diffusion barrier may be composed of a nitride; an oxide, such as $SiO_2$; a SiN; or a combination thereof. The diffusion barrier may have a thickness ranging from approximately 100-500 nm, although lesser and greater thicknesses are contemplated. The first dielectric layer 110 may be formed using a conventional deposition process such as, for example by atomic layer deposition (ALD), chemical vapor deposition (CVD), physical vapor deposition (PVD), molecular beam deposition (MBD), pulsed laser deposition (PLD), or liquid source misted chemical deposition (LSMCD).

Figure 2:
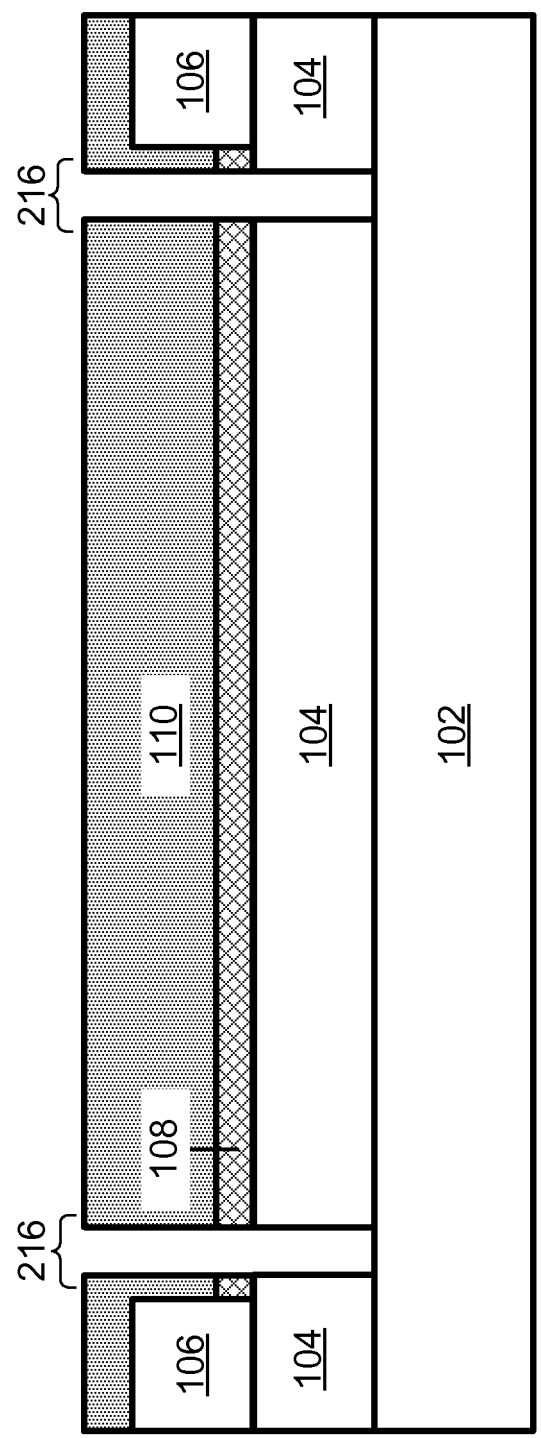
FIG. 2 is a cross section view illustrating forming trenches in the semiconductor structure, in accordance with an embodiment of the present invention.

Referring now to FIG. 2, a cross section view illustrating forming a first set of one or more cavity trenches 216 (hereinafter "first set of trenches") in the semiconductor structure 100 is shown. In an embodiment, the first set of trenches 216 may be formed during middle of the line (MEOL) processing. The first set of trenches 216 may be formed by etching the first dielectric layer 110, the SOI layer 108, and the buried insulator layer 104. The first set of trenches 216 may be formed using a conventional etching techniques, such as, for example, reactive ion etching (RIE). In an embodiment, the first set of trenches 216 may extend from an upper surface of the first dielectric layer 110 to an upper surface of the base substrate layer 102. In another embodiment, the first set of trenches 216 may extend from the upper surface of the first dielectric layer 110 to an interior region of the base substrate layer 102.

Figure 3:
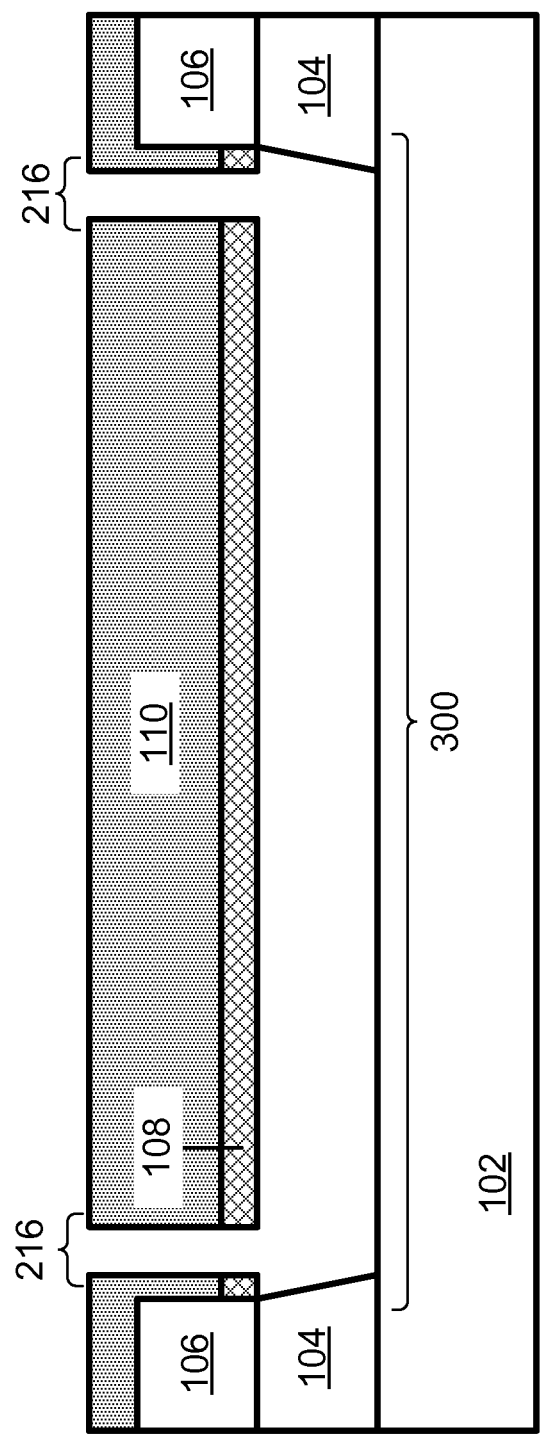
FIG. 3 is a cross section view illustrating forming a cavity in a buried layer of the semiconductor structure, in accordance with an embodiment of the present invention.

Referring now to FIG. 3, a cross section view illustrating forming a cavity 300 in the buried insulator layer 104 of the semiconductor structure 100 is shown. In an embodiment, the cavity 300 may be formed by etching the buried insulator layer 104 selective to the base substrate layer 102, the devices 106, and the SOI layer 108 using a conventional etching technique, such as, for example isotropic wet etching. In an embodiment, the cavity 300 may be formed by using a conventional isotropic wet etch technique such as, for example, a dilute HF wet etch, a buffered HF wet etch, a KOH wet etch, or another wet etch of similar chemistry. Although FIG. 3 illustrates the cavity 300 having a height that is equal to the entire thickness of the buried insulator layer 104, the cavity 300 may have a height that is less than equal to the entire thickness of the buried insulator layer 104.

Figure 4:
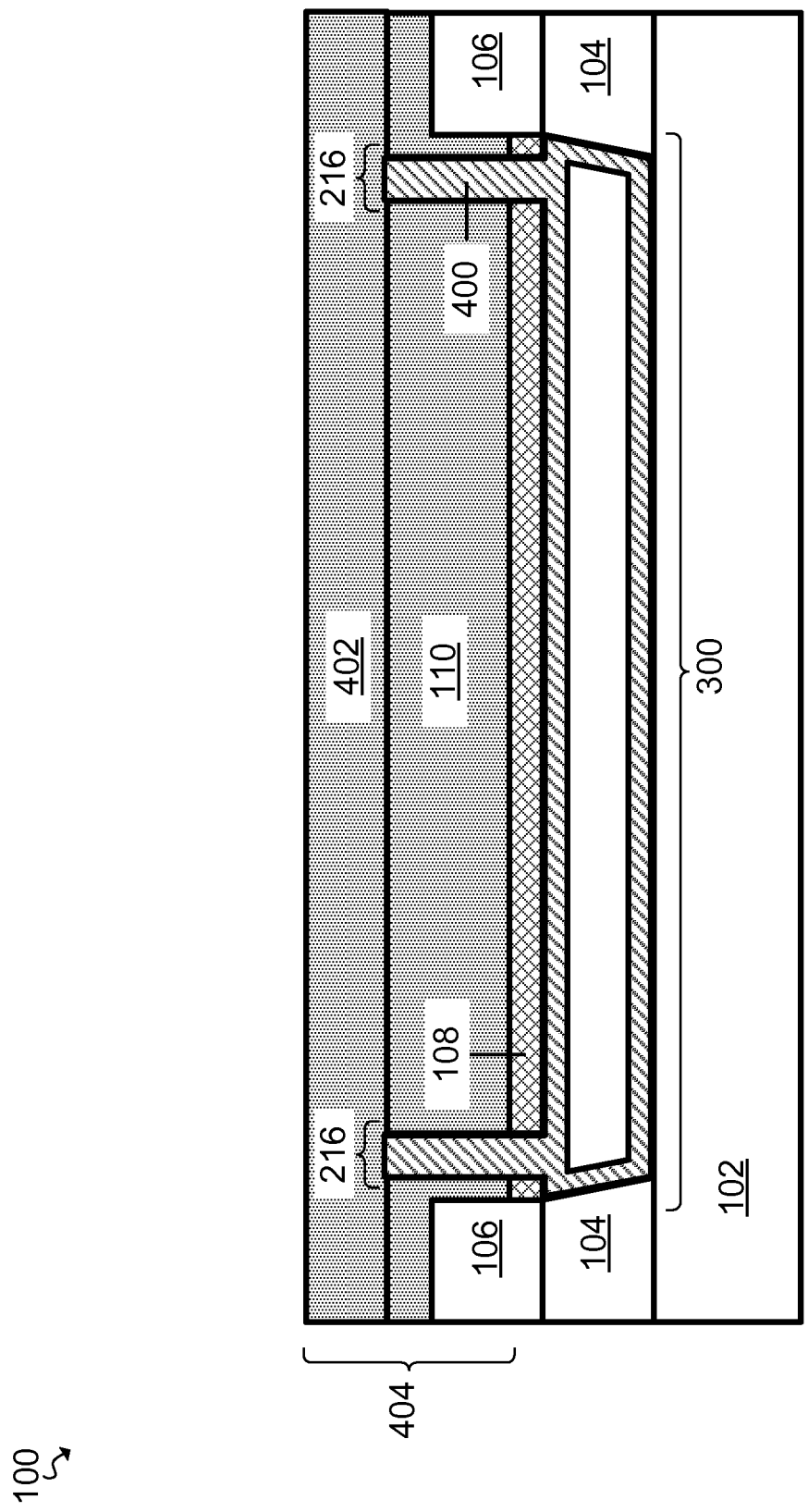
FIG. 4 is a cross section view illustrating filling the cavity and trenches in the semiconductor structure with a thermally conductive and electrically isolating material, in accordance with an embodiment of the present invention.

Referring now to FIG. 4, a cross section view illustrating filling the cavity 300 and first set of trenches 216 with a first material 400 is shown. The first material 400 may be composed of a thermally conductive and electrically isolating material. In an embodiment, the first material 400 may include, but is not limited to, aluminum nitride (AlN), silicon (Si), silicon dioxide ($SiO_2$), sapphire, beryllium oxide (BeO), or alumina. In an embodiment, the cavity 300 and first set of trenches 216 may be filled with the first material 400 using a conventional deposition technique, such as, for example, CVD, PECVD, THCVD, sputtering, or spin-on deposition.

In an embodiment, the first material 400 may be deposited until it closes the openings of the first set of trenches 216, which may occur before the cavity 300 is entirely filled. In this embodiment, the first set of trenches 216 may be very narrow in width and the cavity 300 may be very large relative to one another. Because the first material 400 may accumulate on the walls of the first set of trenches 216, the first set of trenches 216 may close before the cavity 300 fills, which may leave an air pocket in the cavity 300. The partially filled cavity 300 containing an air gap may improve the performance of the inductor by improving the Q value and resonance frequency. In an embodiment, the first material 400 may not be deposited uniformly throughout the cavity 300 (i.e., the first material 400 may accumulate below the first set of trenches 216), creating various defects (not shown) that do not affect the heat dissipation function of the first material 400. In another embodiment, the first set of trenches 216 may be wide and the cavity 300 may be relatively small relative to one another. In this embodiment, the cavity 300 may be filled with the deposited first material 400 before the first set of trenches 216 are closed.

After the first material 400 is deposited, a planarization process, such as chemical mechanical planarization (CMP), may then be performed to remove any excess deposited first material 400 from the first set of trenches 216. In an embodiment, an upper surface of the first material 400 may be substantially flush with an upper surface of the first dielectric layer 110. A second dielectric layer 402 may then be formed on the first dielectric layer 110 to form a back end of the line (BEOL) layer 404. The second dielectric layer 402 may be composed of one or several layers of an insulating material, such as, for example, an oxide, a nitride, or a BPSG. The second dielectric layer 402 may be formed using a conventional deposition process such as, for example by ALD, CVD, PVD, MBD, PLD, and LSMCD.

Figure 5:
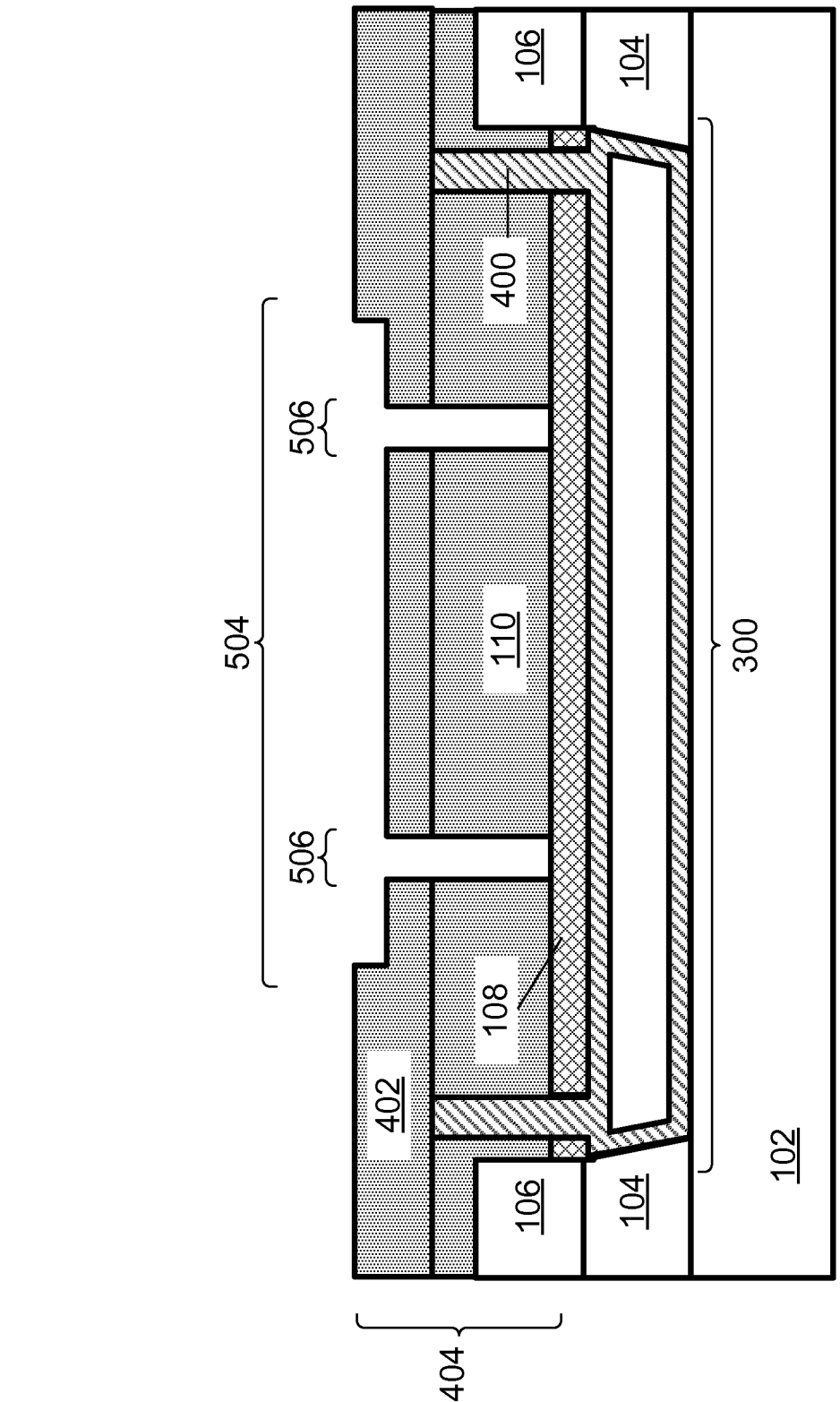
FIG. 5 is a cross section view illustrating forming trenches in the semiconductor structure and forming a device region, in accordance with an embodiment of the present invention.

Referring now to FIG. 5, a cross section view illustrating forming a set of one or more device trenches 506 (hereinafter "second set of trenches") and removing a portion of the BEOL layer 404 form a device region 504 is shown. In an embodiment, a second set of trenches 506 may be formed by etching the BEOL layer 404. The second set of trenches 506 may be formed using conventional etching technique, such as RIE. In an embodiment, the second set of trenches 506 may be etched selective to the SOI layer 108, so that the second set of trenches 506 extend to an upper surface of the SOI layer 108. In another embodiment, the second set of trenches 506 may extend into the SOI layer 108 and may expose an upper surface of the first material 400. A device region 504 may be formed over the second set of trenches 506 by removing a portion of the BEOL layer 404 using a conventional patterning and etching process, such as photolithography and RIE.

Figure 6:
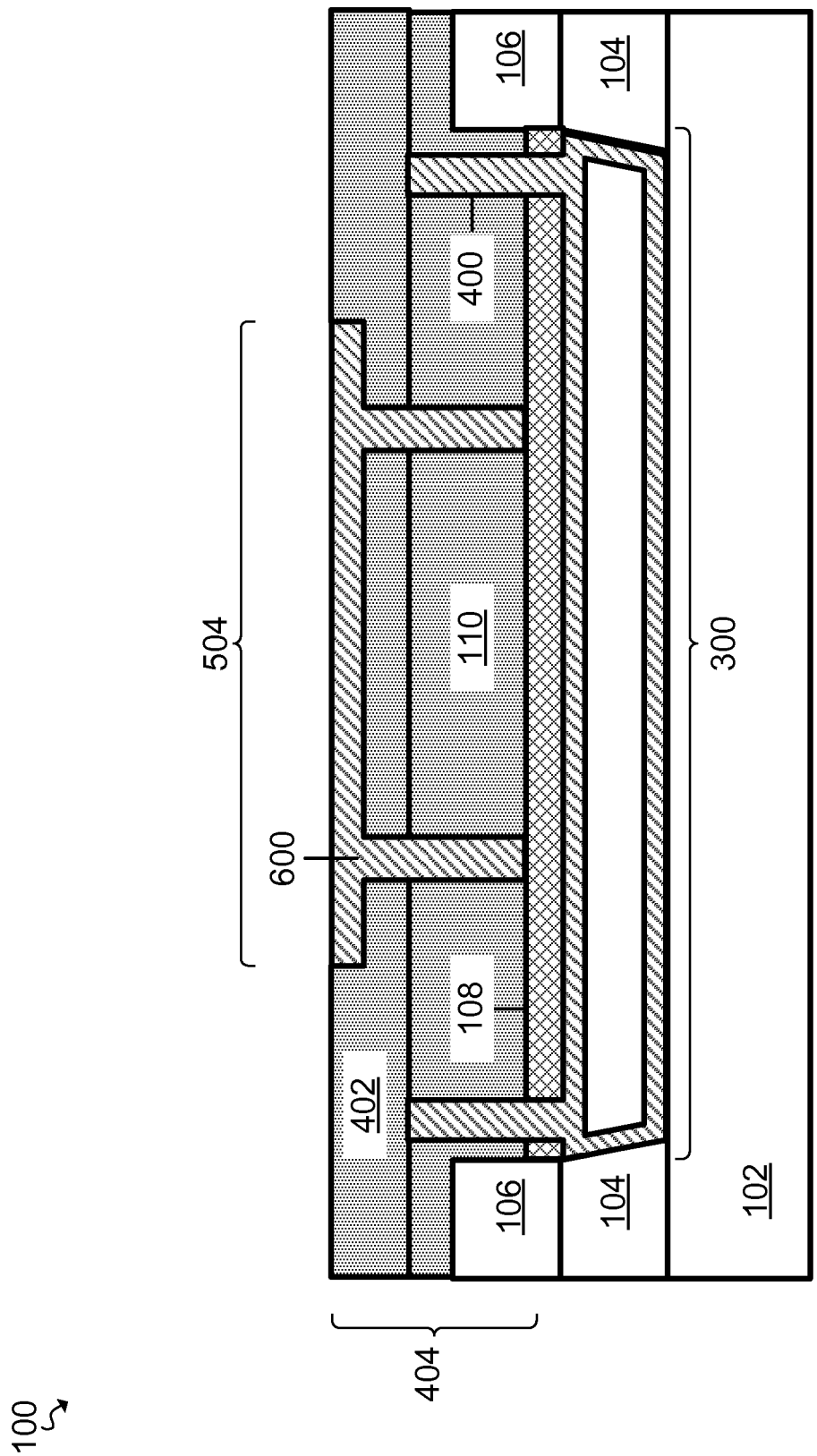
FIG. 6 is a cross section view illustrating filling the trenches and device region with thermally conductive and electrically isolating material, in accordance with an embodiment of the present invention.

Referring now to FIG. 6, a cross section view illustrating filling the device region 504 and the second set of trenches 506 (FIG. 5) with a second material 600 is shown. The second material 600 may be composed of a thermally conductive and electrically isolating material. In an embodiment, the second material 600 may include, but is not limited to, AlN, Si, $SiO_2$, Sapphire, BeO, or Alumina. The second material 600 may be deposited using a conventional deposition technique, such as, for example, CVD, PECVD, THCVD, sputtering, or spin-on deposition. It should be noted that embodiments are contemplated in which the first material 400 and the second material 600 are composed of materials having the same composition, and in which the composition of the first material 400 is different than the composition of the second material 600. A planarization process, such as CMP, may be performed to remove any excess deposited second material 600 from the BEOL layer 404.

Figure 7:
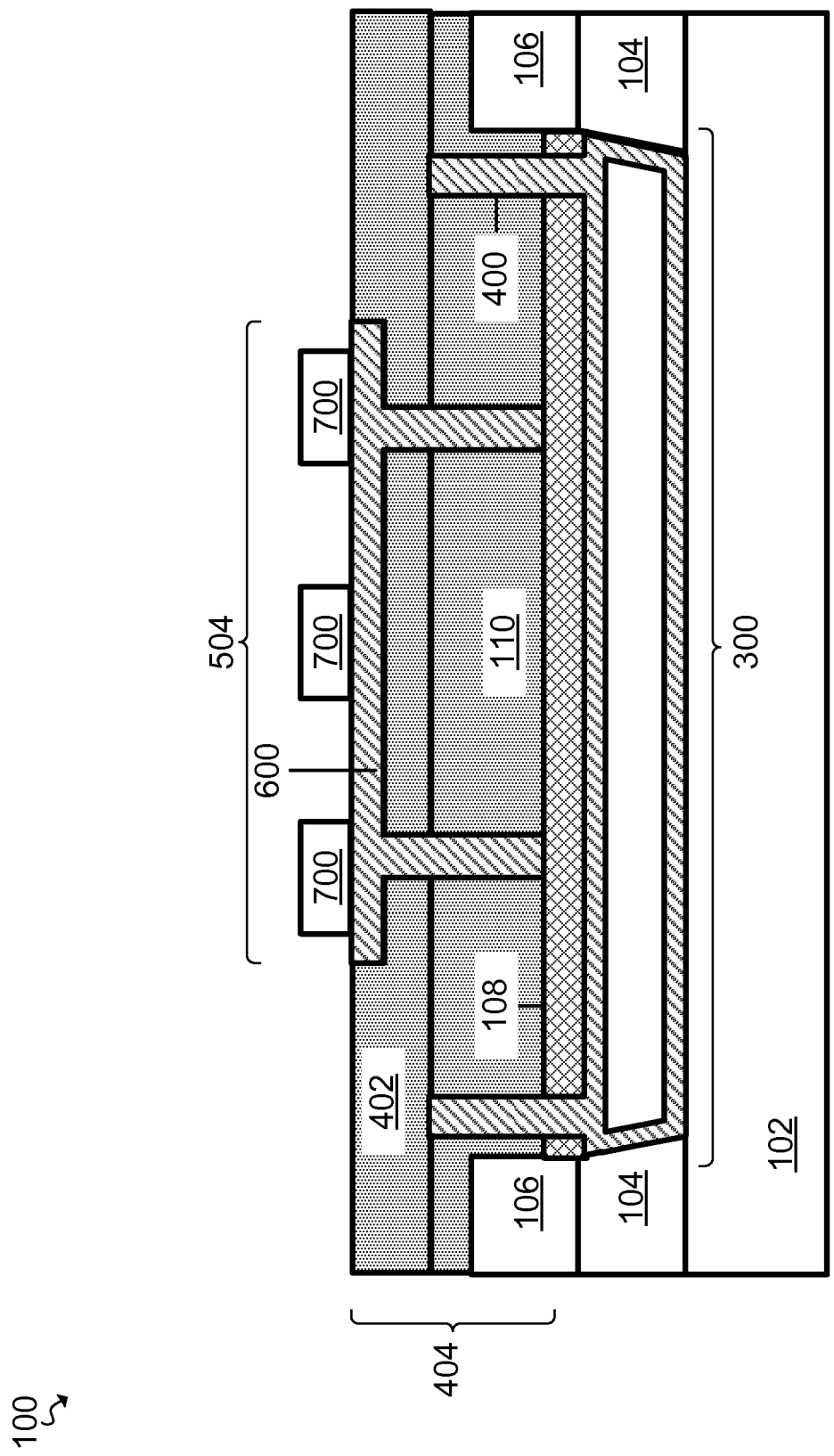
FIG. 7 is a cross section view illustrating forming an inductor over the device region, in accordance with an embodiment of the present invention.

Referring now to FIG. 7, a cross section view illustrating forming an inductor 700 on the second material 600 is shown. The inductor 700 may be formed by any conventional metallization process known in the art. In an embodiment, the inductor 700 may be formed by aluminum (Al) metallization. The Al metallization may include a so-called subtraction process. A blanket Al film (not shown) may be sputter-deposited onto the wafers, and then patterned with photolithography and etch.

In another embodiment, the inductor 700 may be formed by copper (Cu) metallization. The Cu metallization may include a so-called inlaid or damascene process. A blanket dielectric layer (not shown) may be deposited first. A conventional photolithography and etching process may then be used to form trenches in the dielectric layer. In an embodiment, a barrier layer (not shown) composed of, for example, a metal nitride may then be formed in the trenches. Subsequently, a Cu seed layer may be formed on the barrier layer before a layer of Cu is formed in the trenches using a conventional deposition process such as, for example, electrochemical plating. After the Cu is deposited, a planarization process, such as, for example, chemical mechanical polishing (CMP) may then be used to remove Cu film from an upper surface of the dielectric layer.

Another embodiment by which to fill a cavity formed in a buried insulator layer and trenches in a semiconductor structure below an inductor with high thermally conductive and electrically isolating material to improve heat dissipation of devices and inductors is described below with reference to FIGS. 8-12.

Figure 8:
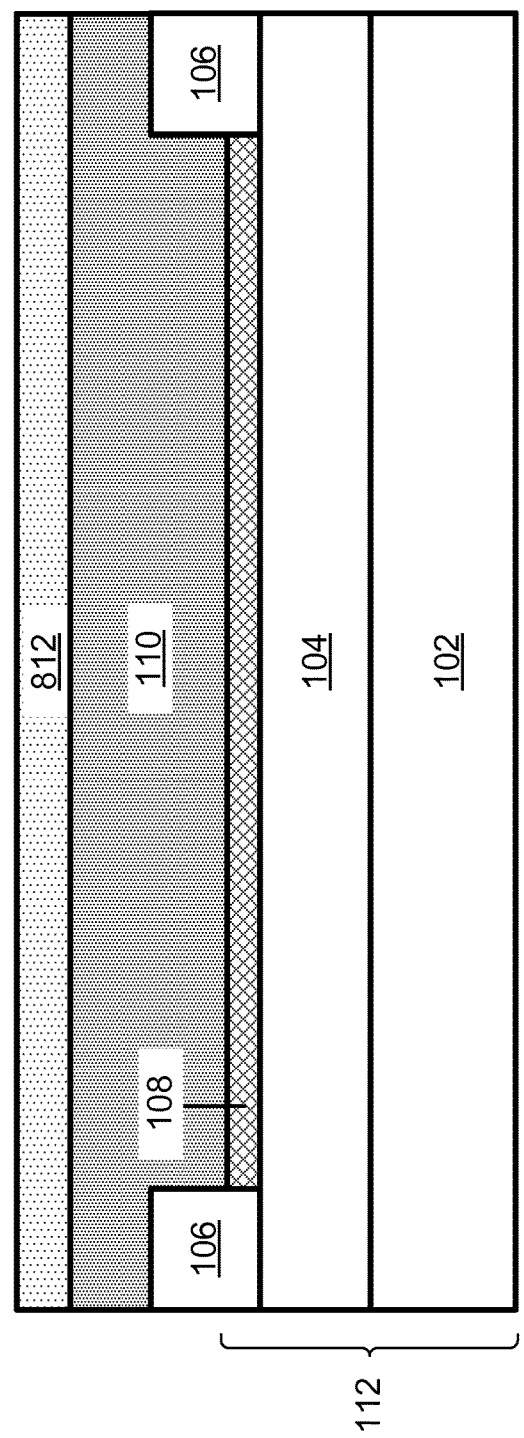
FIG. 8 is a cross section view illustrating a semiconductor structure, in accordance with an embodiment of the present invention.

Referring now to FIG. 8, a cross section view of a semiconductor structure 800 is shown. The semiconductor structure 800 may be substantially similar to the semiconductor structure 100 (FIG. 1) and may be formed using substantially similar techniques as those described above with reference to FIG. 1. However, the structure 800 may include an additional BEOL dielectric layer 812 formed on the first dielectric layer 110 during BEOL processing. In an embodiment, the BEOL dielectric layer 812 may be composed of one or several layers of an insulating material, such as, for example, a nitride, a BPSG, or an oxide, such as $SiO_2$;

SiN; or combinations thereof. The BEOL dielectric layer 812 may be formed using a conventional deposition process such as, for example by ALD, CVD, PVD, MBD, PLD, or LSMCD.

Figure 9:
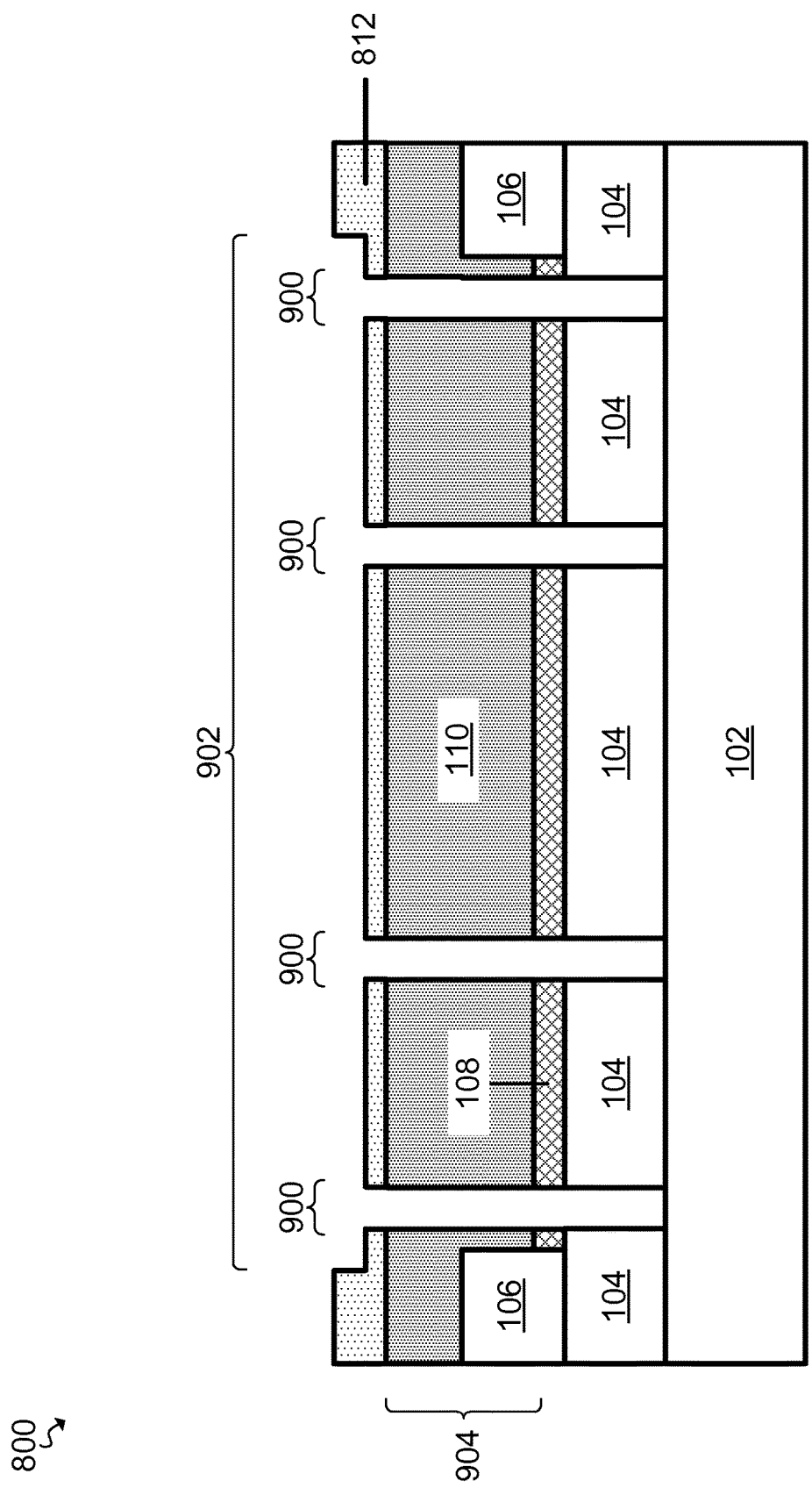
FIG. 9 is a cross section view illustrating forming trenches in the semiconductor structure and forming a device region, in accordance with an embodiment of the present invention.

Referring now to FIG. 9, a cross section view illustrating forming cavity trenches 900 (hereinafter "trenches") and a device region 902 is shown. In an embodiment, the trenches 900 may be formed during BEOL processing. The trenches 900 may be formed by etching the BEOL dielectric layer 812, the dielectric layer 110, the SOI layer 108, and the buried insulator layer 104. Therefore, the trenches 900 may have an upper portion 904 that extends through the BEOL layer 812. The trenches 900 may be formed using conventional etching techniques, such as, for example, RIE. In an embodiment, the trenches 900 may extend from a bottom surface of the device region 902 to an upper surface of the base substrate layer 102. In another embodiment, the trenches 900 may extend from the bottom surface of the device region 902 to an interior region of the base substrate layer 102. The device region 902 be formed over the trenches 900 by removing a portion of the BEOL dielectric layer 812 using a conventional patterning and etching process, such as photolithography and RIE.

Figure 10:
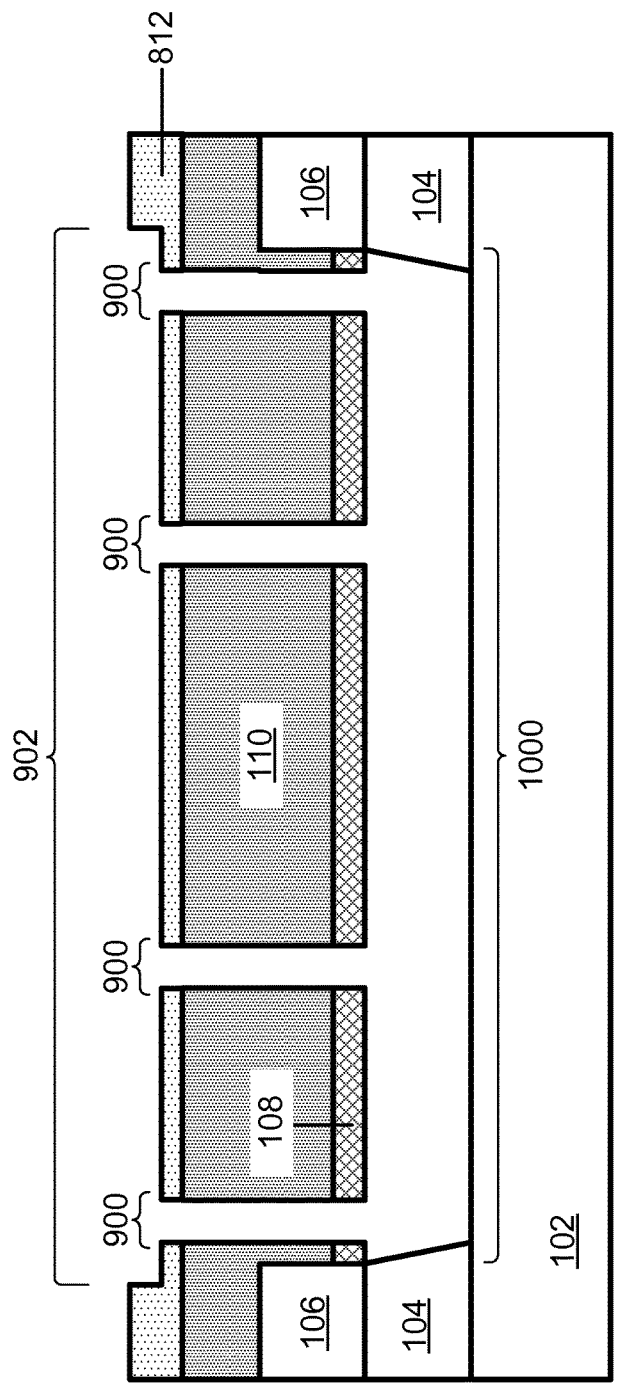
FIG. 10 is a cross section view illustrating forming a cavity in the buried layer of the semiconductor structure, in accordance with an embodiment of the present invention.

Referring now to FIG. 10, a cross section view illustrating forming a cavity 1000 in the buried insulator layer 104 of the semiconductor structure 100 is shown. In an embodiment, the cavity 1000 may be formed by etching the buried insulator layer 104 selective to the base substrate layer 102, the devices 106, and the SOI layer 108 using a conventional etching technique, such as, for example isotropic wet etching. In an embodiment, the cavity 300 may be formed by using a conventional isotropic wet etch technique such as, for example, a dilute HF wet etch, a buffered HF wet etch, a KOH wet etch, or another wet etch of similar chemistry. Although FIG. 10 illustrates the cavity 1000 having a height that is equal to an entire thickness of the buried insulator layer 104, the cavity 1000 may have a height that is less than equal to an entire thickness of the buried insulator layer 104.

Figure 11:
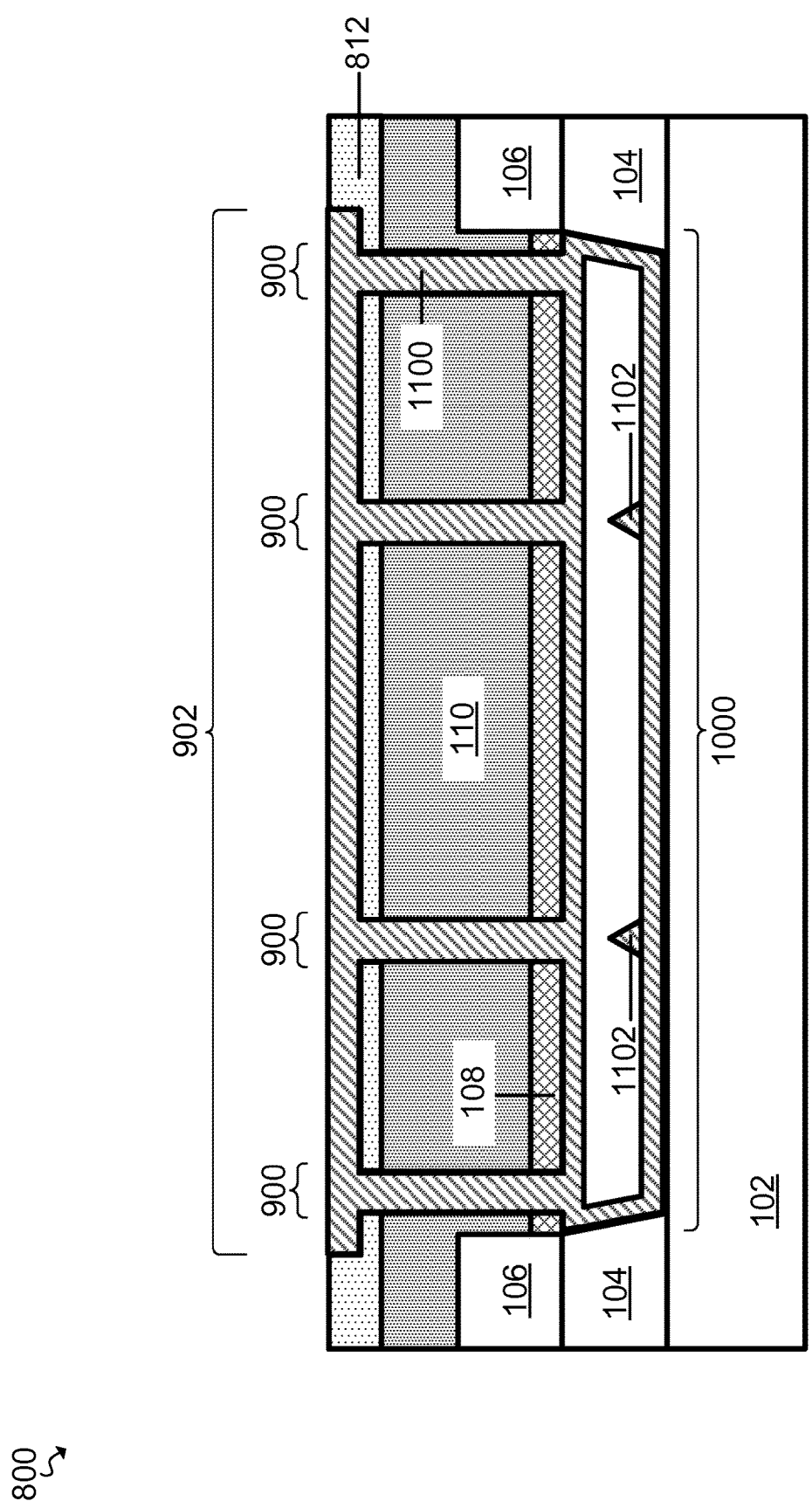
FIG. 11 is a cross section view illustrating filling the trenches, cavity, and the device region with thermally conductive and electrically isolating material, in accordance with an embodiment of the present invention.

Referring now to FIG. 11, a cross section view illustrating filling the cavity 1000, the trenches 900, and the device region 902 with a material 1100 is shown. The material 1100 may be composed of a thermally conductive and electrically isolating material. In an embodiment, the material 1100 may include, but is not limited to, AlN, Si, SiO$_2$, Sapphire, BeO, or Alumina. In an embodiment, the material may be deposited using a conventional deposition technique, such as, for example, CVD, PECVD, THCVD, sputtering, or spin-on deposition.

In an embodiment, the material 1100 may be deposited until it closes the openings of the trenches 900, which may occur before the cavity 1000 is entirely filled. In this embodiment, the trenches 900 may be very narrow in width and the cavity 1000 may be very large, in relation to one another. Because the material 1100 may accumulate on the walls of the trenches 900, the trenches 900 may close before the cavity 1000 fills, which may leave an air pocket in the cavity 1000. The partially filled cavity 1000 containing an air gap may improve the performance of the inductor by improving the Q value and resonance frequency. In an embodiment, the material 1100 may not be deposited uniformly throughout the cavity 1000 (i.e., the material 1100 may accumulate below the trenches 900), creating various defects 1102 that do not affect the heat dissipation function of the material 1100. In another embodiment, the trenches 900 may be wide and the cavity 1000 may be relatively small, in relation to one another. In this embodiment, the cavity 1000 may be filled with the deposited material 1100 before the trenches 900 are closed.

After deposition, a planarization process, such as CMP, may then be performed to remove any excess material 1100 from the device region 902, so that an upper surface of the material 1100 is substantially flush with an upper surface of the BEOL layer 812.

Figure 12:
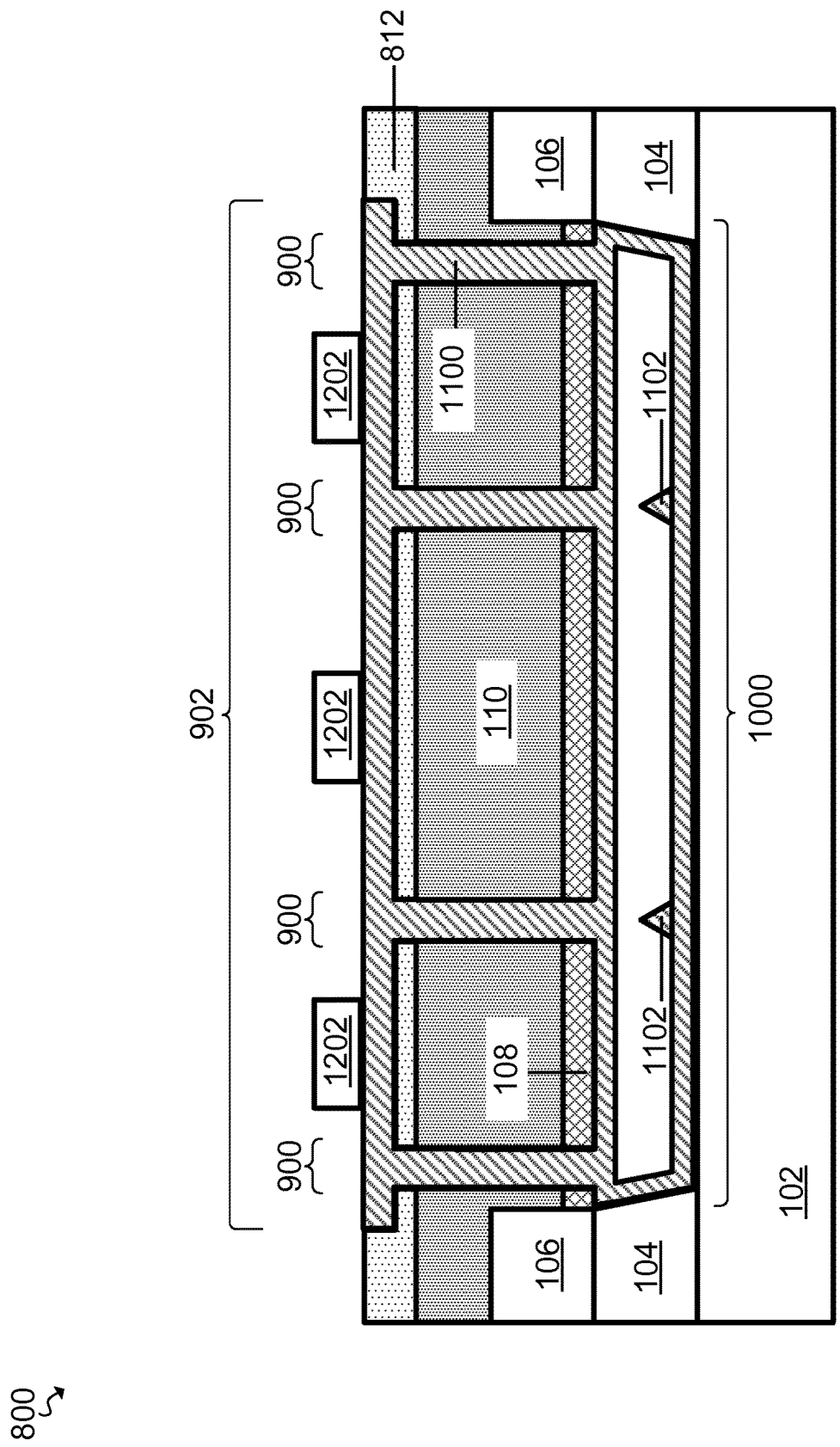
FIG. 12 is a cross section view illustrating forming an inductor over the device region, in accordance with an embodiment of the present invention.

Referring now to FIG. 12, a cross section view illustrating forming an inductor 1202 over the device region 902 is shown. The inductor 1202 may be formed by any conventional metallization process known in the art. In an embodiment, the inductor 1202 may be formed by aluminum (Al) metallization. The Al metallization may include a so-called subtraction process. A blanket Al film (not shown) may be sputter-deposited onto the wafers, and then patterned with photolithography and etch.

In another embodiment, the inductor 1202 may be formed by copper (Cu) metallization. The Cu metallization may include a so-called inlaid or damascene process. A blanket dielectric layer (not shown) may be deposited first. A conventional photolithography and etching process may then be used to form trenches in the dielectric layer. In an embodiment, a barrier layer (not shown) composed of, for example, a metal nitride may then be formed in the trenches. Subsequently, a Cu seed layer may be formed on the barrier layer before a layer of Cu is formed in the trenches using a conventional deposition process such as, for example, electrochemical plating. After the Cu is deposited, a planarization process, such as, for example, chemical mechanical polishing (CMP) may then be used to remove Cu film from an upper surface of the dielectric layer.

Another embodiment by which to fill a cavity formed in a buried insulator layer and trenches in a semiconductor structure below an inductor with high thermally conductive and electrically isolating material to improve heat dissipation of devices and inductors is described below with reference to FIGS. 13-18.

Figure 13:
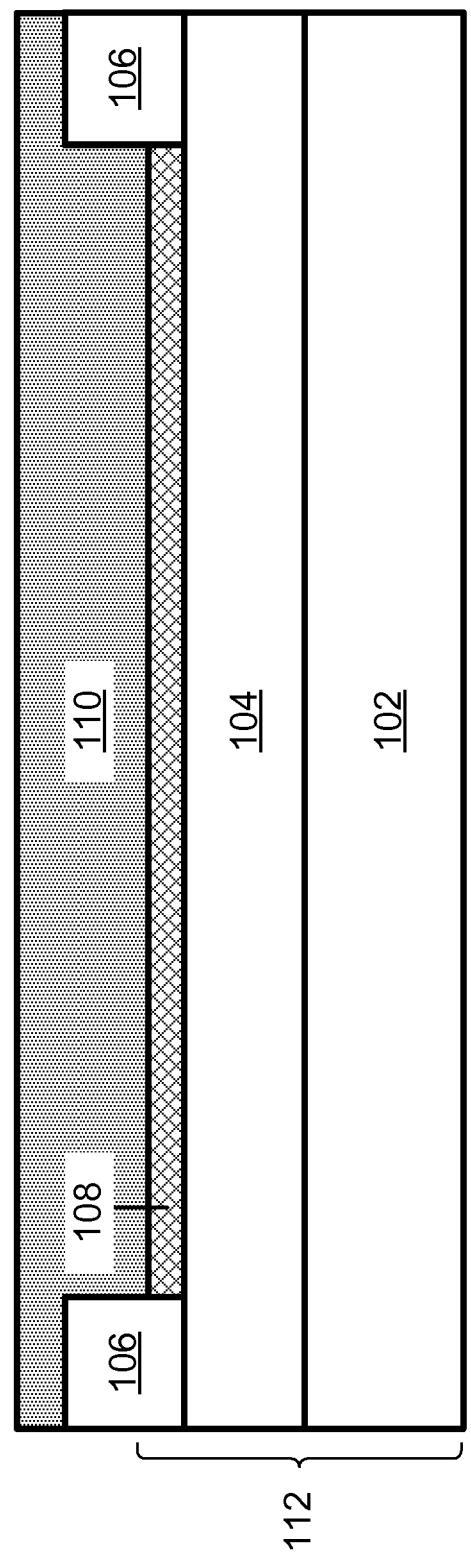
FIG. 13 is a cross section view illustrating a semiconductor structure, in accordance with an embodiment of the present invention.

Referring now to FIG. 13, a cross section view of a semiconductor structure 1300 is shown. The semiconductor structure 1300 may be substantially similar to the semiconductor structure 100 (FIG. 1) and may be formed using substantially similar techniques as those described above with reference to FIG. 1.

Figure 14:
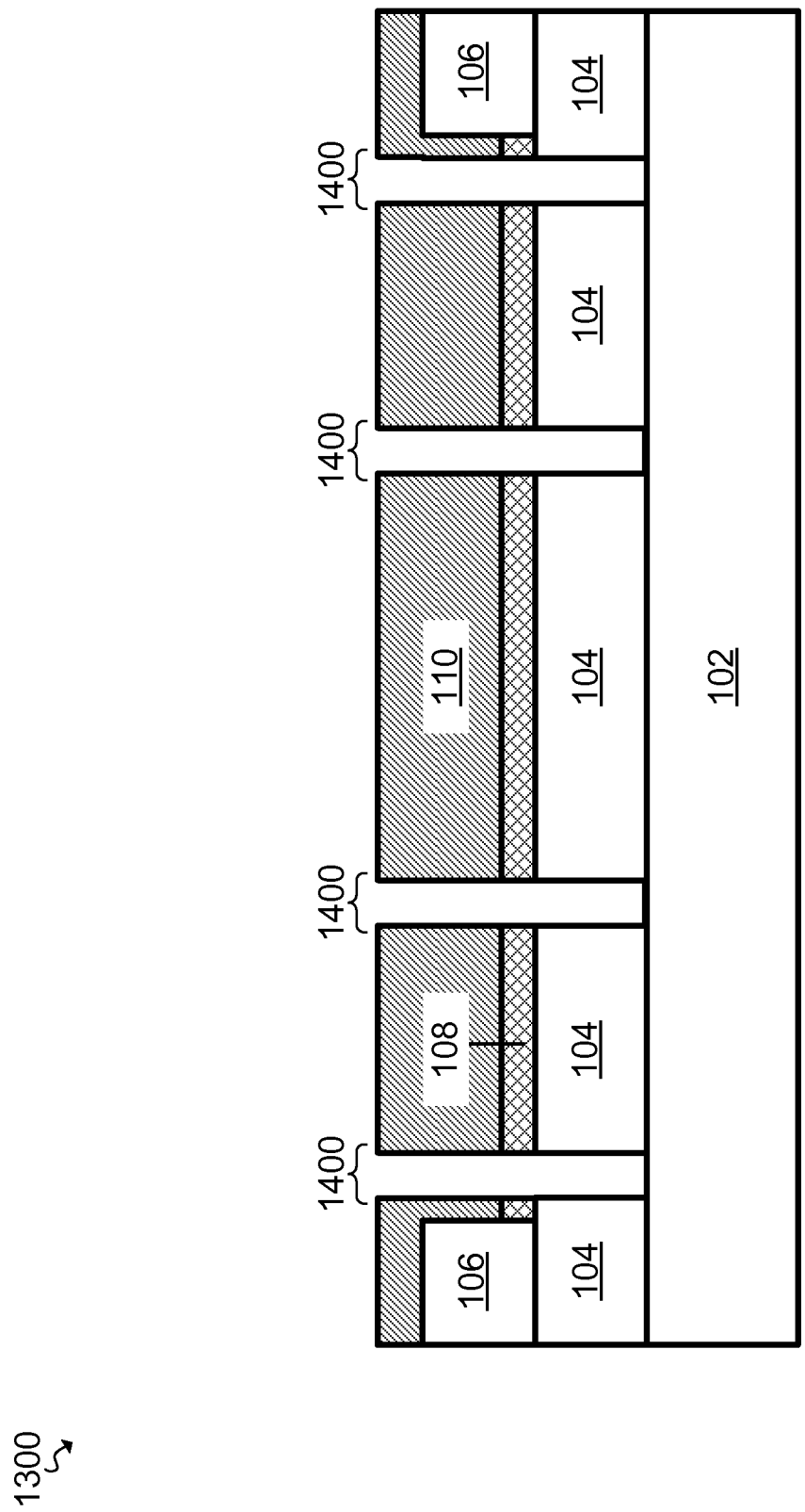
FIG. 14 is a cross section view illustrating forming trenches in the semiconductor structure, in accordance with an embodiment of the present invention.

Referring now to FIG. 14, a cross section view illustrating forming cavity trenches 1400 (hereinafter "trenches") is shown. In an embodiment, the trenches 1400 may be formed during MEOL processing. The trenches 1400 may be formed by etching the first dielectric layer 110, the SOI layer 108, and the buried insulator layer 104. The trenches 1400 may be formed using a conventional etching technique, such as, for example, RIE. In an embodiment, the trenches 1400 may extend from an upper surface of the first dielectric layer 110 to an upper surface of the base substrate layer 102. In another embodiment, the trenches 1400 may extend from the upper surface of the first dielectric layer 110 to an interior region of the base substrate layer 102.

Figure 15:
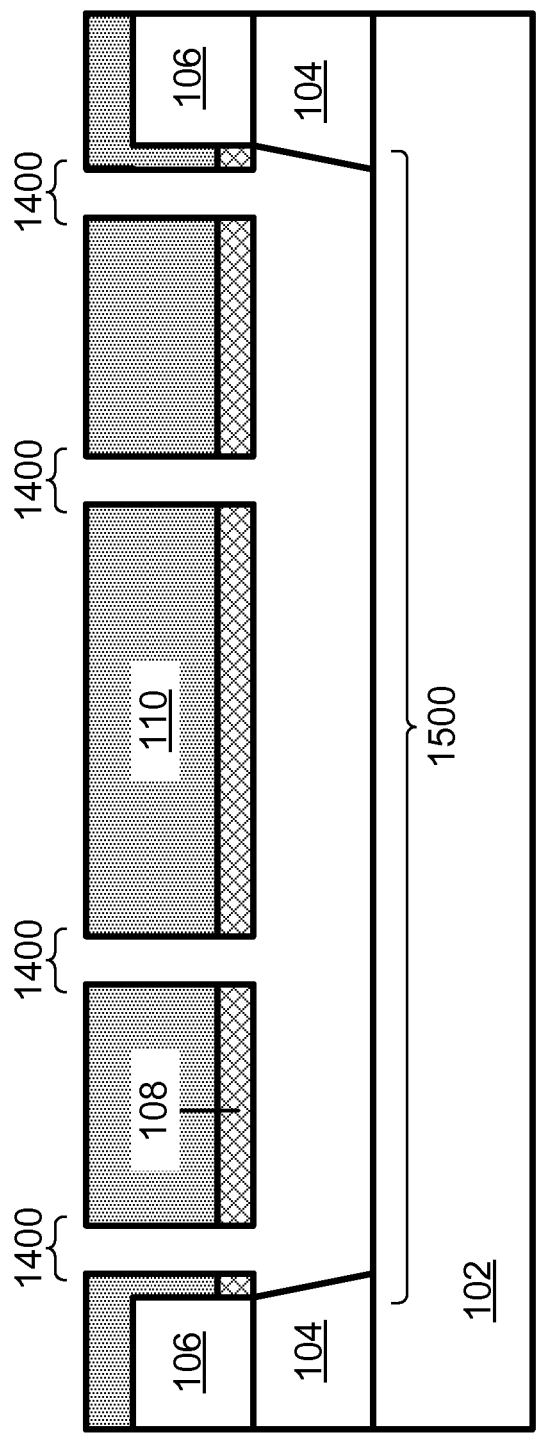
FIG. 15 is a cross section view illustrating forming a cavity in the buried layer of the semiconductor structure, in accordance with an embodiment of the present invention.

Referring now to FIG. 15, a cross section view illustrating forming a cavity 1500 in the buried insulator layer 104 of the semiconductor structure 100 is shown. In an embodiment, the cavity 1500 may be formed by etching the buried insulator layer 104 selective to the base substrate layer 102, the devices 106, and the SOI layer 108 using a conventional isotropic wet etch technique such as, for example, a dilute HF wet etch, a buffered HF wet etch, a KOH wet etch, or another wet etch of similar chemistry. Although FIG. 15 illustrates the cavity 1500 having a height that is equal to an entire thickness of the buried insulator layer 104, the cavity 1500 may have a height that is less than equal to an entire thickness of the buried insulator layer 104.

Figure 16:
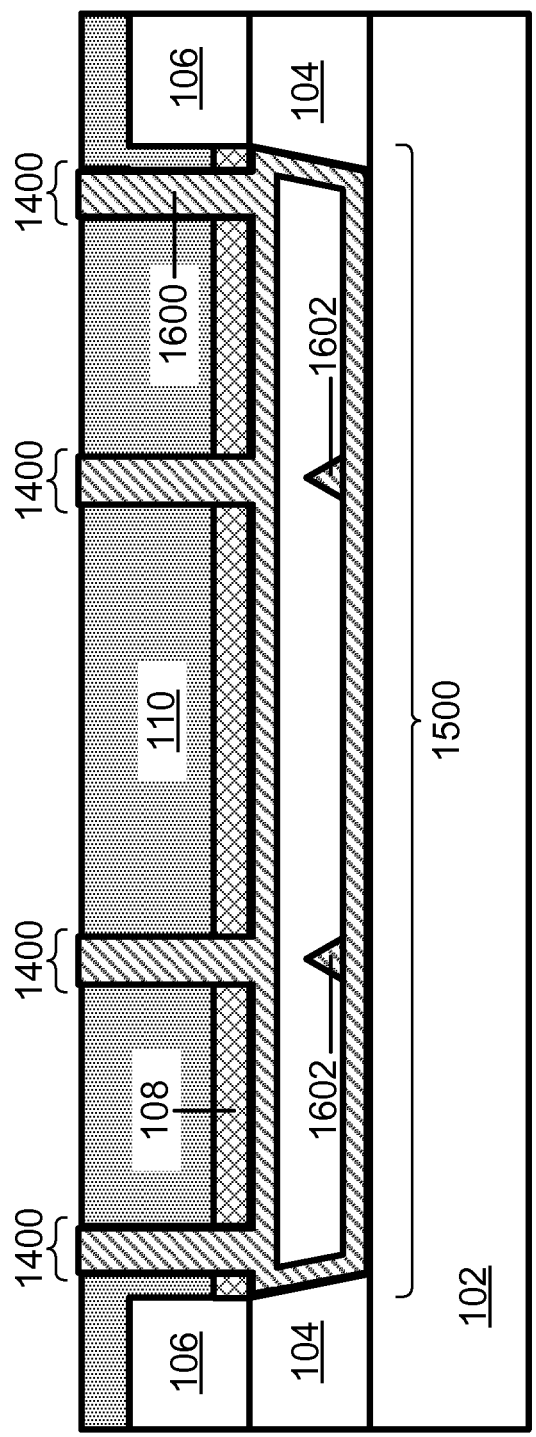
FIG. 16 is a cross section view illustrating filling the trenches and the cavity with thermally conductive and electrically isolating material, in accordance with an embodiment of the present invention.

Referring now to FIG. 16, a cross section view illustrating filling the cavity 1500, and the trenches 1400 with a material 1600 is shown. The material 1600 may be composed of a thermally conductive and electrically isolating material. In an embodiment, the material 1600 may include, but is not limited to, AlN, Si, $SiO_2$, Sapphire, BeO, or Alumina. In an embodiment, the material may be deposited using a conventional deposition technique, such as, for example, CVD, PECVD, THCVD, sputtering, or spin-on deposition.

In an embodiment, the material 1600 may be deposited until it closes the openings of the trenches 1400, which may occur before the cavity 1500 is entirely filled. In this embodiment, the trenches 1400 may be very narrow in width and the cavity 1500 may be very large, in relation to one another. Because the material 1600 may accumulate on the walls of the trenches 1400, the trenches 1400 may close before the cavity 1500 fills, which may leave an air pocket in the cavity 1500. The partially filled cavity 1500 containing an air gap may improve the performance of the inductor by improving the Q value and resonance frequency. In an embodiment, the material 1600 may not be deposited uniformly throughout the cavity 1500 (i.e., the material 1600 may accumulate below the trenches 1400), creating various defects 1602 that do not affect the heat dissipation function of the material 1600. In another embodiment, the trenches 1400 may be wide and the cavity 1500 may be relatively small, in relation to one another. In this embodiment, the cavity 1500 may be filled with the deposited material 1600 before the trenches 1400 are closed.

After deposition, a planarization process, such as CMP, may then be performed to remove any excess material 1600 from the dielectric layer 110, so that an upper surface of the material 1600 is substantially flush with an upper surface of the first dielectric layer 110.

Figure 17:
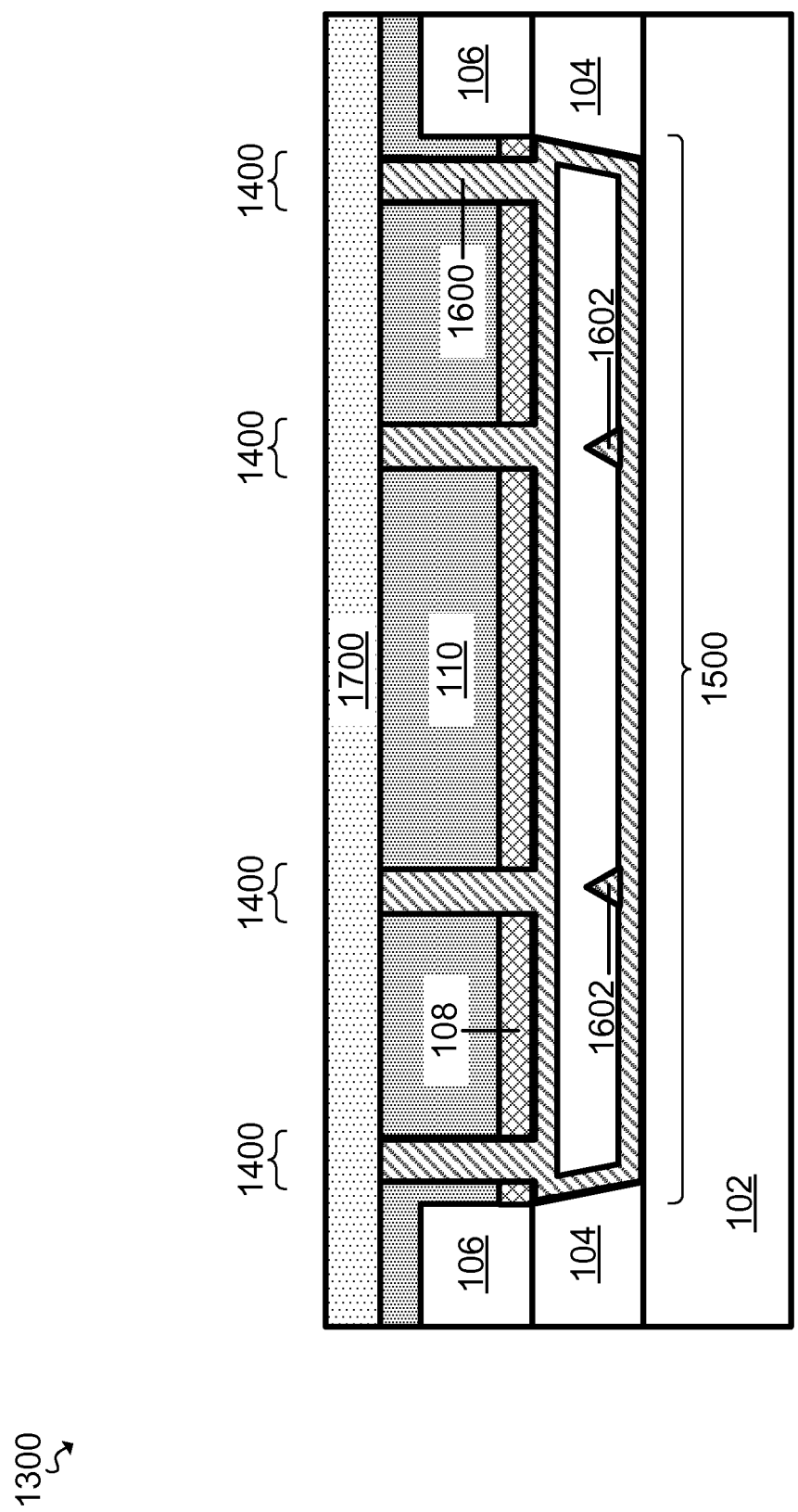
FIG. 17 is a cross section view illustrating forming a back end of the line dielectric layer on the dielectric layer during back end of the line processing.

Referring now to FIG. 17, a cross section view forming a BEOL dielectric layer 1700 on the dielectric layer 110 during BEOL processing is shown. In an embodiment, the BEOL dielectric layer 1700 may be composed of one or several layers of an insulating material, such as, for example, a nitride, a BPSG, or an oxide, such as $SiO_2$, SiN, or combinations thereof. The BEOL dielectric layer 1700 may be formed using a conventional deposition process such as, for example by ALD, CVD, PVD, MBD, PLD, or LSMCD.

Figure 18:
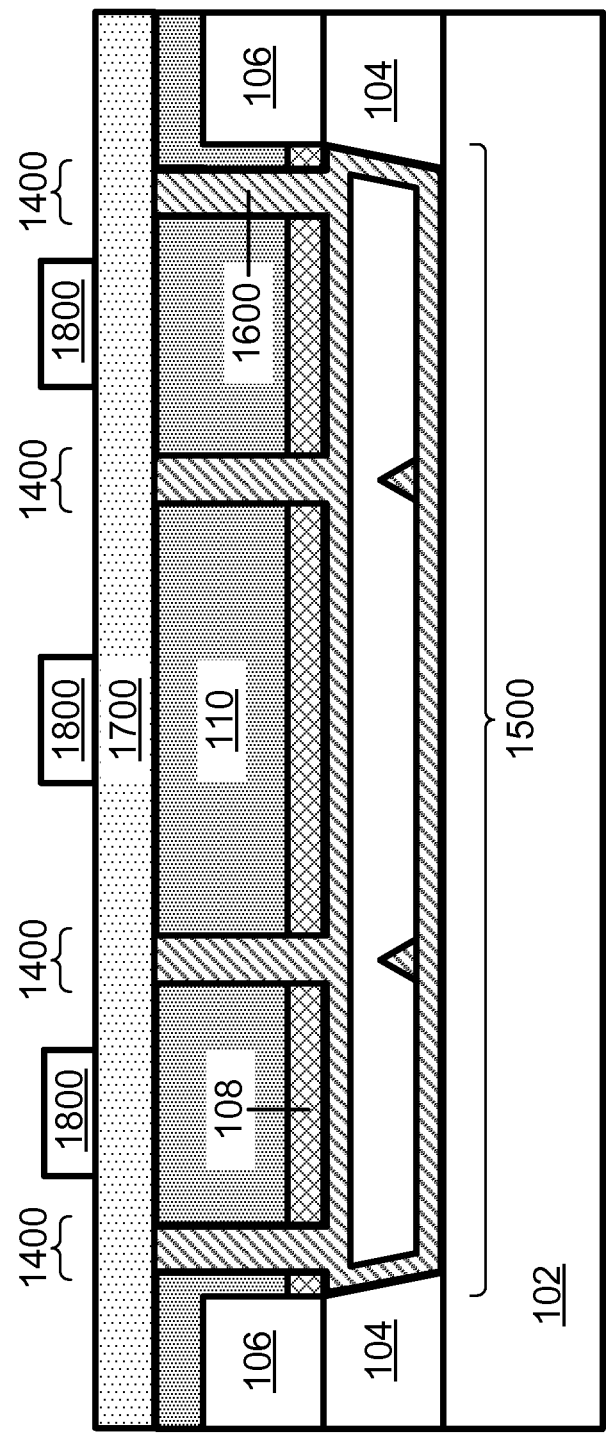
FIG. 18 is a cross section view illustrating forming an inductor over the back end of the line dielectric layer.

Referring now to FIG. 18, a cross section view illustrating forming an inductor 1800 over the BEOL dielectric layer 1700 is shown. The inductor 1800 may be formed by any conventional metallization process known in the art. In an embodiment, the inductor 1800 may be formed by aluminum (Al) metallization. The Al metallization may include a so-called subtraction process. A blanket Al film (not shown) may be sputter-deposited onto the wafers, and then patterned with photolithography and etch.

In another embodiment, the inductor 1800 may be formed by copper (Cu) metallization. The Cu metallization may include a so-called inlaid or damascene process. A blanket dielectric layer (not shown) may be deposited first. A conventional photolithography and etching process may then be used to form trenches in the dielectric layer. In an embodiment, a barrier layer (not shown) composed of, for example, a metal nitride may then be formed in the trenches. Subsequently, a Cu seed layer may be formed on the barrier layer before a layer of Cu is formed in the trenches using a conventional deposition process such as, for example, electrochemical plating. After the Cu is deposited, a planarization process, such as, for example, chemical mechanical polishing (CMP) may then be used to remove Cu film from an upper surface of the dielectric layer.

Embodiments of the present invention may improve heat dissipation of devices and inductors formed on semiconductor structures by filling portions of the semiconductor structure with high thermally conductive and electrically isolating material. By improving the efficiency of heat dissipation in the structures of these embodiments, the reliability of the devices and the Q value and resonance frequency of the inductors in the semiconductor structures may be improved.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
    forming a first dielectric layer on a semiconductor on insulator (SOI) layer of a SOI substrate, the SOI substrate comprising a buried insulator layer located between the SOI layer and a base substrate layer;
    forming a cavity trench through the first dielectric layer and the SOI layer, the cavity trench exposing the buried insulator layer;
    forming a cavity in the buried insulator layer, wherein the forming the cavity includes removing a portion of the buried insulator layer selective to the base substrate layer and the SOI layer;
    depositing a first material in the cavity,
    wherein the first material is thermally conductive and electrically isolating;
    filling the cavity trench with the first material;
    forming a BEOL dielectric layer on the first dielectric layer;
    forming a device trench through the BEOL dielectric layer and the first dielectric layer by removing material selective to the SOI layer;
    removing a portion of the BEOL dielectric layer to form a device region, a bottom surface of the device region contacting the device trench;
    filling the device trench with a second material, wherein the second material is thermally conductive and electrically isolating;
    filling the device region with the second material; and
    forming an inductor above the cavity on the device region.

2. The method of claim 1,
    wherein the back end of the line (BEOL) dielectric layer is formed between the first dielectric layer and the inductor.

3. The method of claim 1, wherein the forming the cavity in the buried insulator layer comprises:
    removing a portion of the buried insulator layer between a first device and a second device selective to the base substrate layer and the SOI layer.

4. The method of claim 1, wherein the first material comprises aluminum nitride, silicon, silicon dioxide, sapphire, beryllium oxide, or alumina.

5. The method of claim 1, wherein the forming the cavity in the buried insulator layer comprises:

removing an entire thickness of the buried insulator layer selective to the base substrate layer and the SOI layer.

6. The method of claim 1, wherein the forming the cavity in the buried insulator layer comprises:
removing less than an entire thickness of the buried insulator layer selective to the base substrate layer and the SOI layer.

7. The method of claim 1, wherein the depositing the first material in the cavity comprises:
filling all of the cavity trench with the first material.

8. The method of claim 1, wherein the depositing the first material in the cavity comprises:
depositing the first material on a top surface, a bottom surface, and sidewalls of the cavity, such that an air pocket is formed.

9. The method of claim 1, wherein the forming the cavity trench includes forming a first cavity trench and a second cavity trench, and
wherein the forming the cavity in the buried insulator layer includes forming the cavity in the buried insulator laterally from the first cavity trench to the second cavity trench.

10. The method of claim 9, wherein the depositing the first material in the cavity comprises:
depositing the first material on a top surface, a bottom surface, and sidewalls of the cavity, such that an air pocket is formed.

11. The method of claim 1, wherein the first material is deposited extending from an upper surface of the first dielectric layer to the base substrate layer.

12. A method comprising:
forming a first dielectric layer on a semiconductor on insulator (SOI) layer of a SOI substrate, the SOI substrate comprising a buried insulator layer located between the SOI layer and a base substrate layer;
forming a BEOL dielectric layer on the first dielectric layer;
forming a cavity trench through the BEOL dielectric layer, the first dielectric layer, and the SOI layer, the cavity trench exposing the buried insulator layer;
forming a cavity in the buried insulator layer, wherein the forming the cavity includes removing a portion of the buried insulator layer selective to the base substrate layer and the SOI layer;
depositing a first material in the cavity,
wherein the first material is thermally conductive and electrically isolating;
filling the cavity trench with the first material; and
forming an inductor above the cavity, wherein the forming of the inductor includes:
removing a portion of the BEOL dielectric layer to form a device region, a bottom surface of the device region contacting an upper portion of the cavity trench,
filling the device region with a second material, wherein the second material is thermally conductive and electrically isolating, and
forming the inductor on the device region.

13. The method of claim 12, wherein the first material comprises aluminum nitride, silicon, silicon dioxide, sapphire, beryllium oxide, or alumina.

14. The method of claim 12, wherein the depositing the first material in the cavity comprises:
filling all of the cavity trench with the first material.

15. The method of claim 12, wherein the depositing the first material in the cavity comprises:
depositing the first material on a top surface of the cavity, a bottom surface of the cavity, and sidewalls of the cavity, such that an air pocket is formed.

16. The method of claim 12, wherein the forming the cavity trench includes forming a first cavity trench and a second cavity trench, and
wherein the forming the cavity in the buried insulator layer includes forming the cavity in the buried insulator laterally from the first cavity trench to the second cavity trench.

17. The method of claim 16, wherein the depositing the first material in the cavity comprises:
depositing the first material on a top surface, a bottom surface, and sidewalls of the cavity, such that an air pocket is formed.

18. The method of claim 12, wherein the first material is deposited extending from an upper surface of the BEOL dielectric layer to the base substrate layer.

* * * * *